United States Patent [19]
Higuchi

[11] Patent Number: 6,028,805
[45] Date of Patent: Feb. 22, 2000

[54] VOLATILE MEMORY AND EMBEDDED DYNAMIC RANDOM ACCESS MEMORY

[75] Inventor: Takashi Higuchi, Tokyo, Japan

[73] Assignee: Mitsubishi Denki Kabushiki Kaisha, Tokyo, Japan

[21] Appl. No.: 09/186,895

[22] Filed: Nov. 6, 1998

[30] Foreign Application Priority Data

Jul. 3, 1998 [JP] Japan ............................. P10-188728

[51] Int. Cl.[7] .................................................. G11C 7/00
[52] U.S. Cl. ...................................... 365/222; 365/230.03
[58] Field of Search ............................... 365/222, 230.03

[56] References Cited

U.S. PATENT DOCUMENTS

| | | | |
|---|---|---|---|
| 5,499,213 | 3/1996 | Niimi et al. | 365/222 |
| 5,555,527 | 9/1996 | Kotani et al. | 365/222 |
| 5,586,287 | 12/1996 | Okumura et al. | 365/222 |
| 5,835,937 | 11/1998 | Miyoshi | 365/222 |
| 5,901,101 | 5/1999 | Suzuki et al. | 365/222 |

FOREIGN PATENT DOCUMENTS

| | | |
|---|---|---|
| 2-27590 | 1/1990 | Japan . |
| 8-161887 | 6/1996 | Japan . |

*Primary Examiner*—David Nelms
*Assistant Examiner*—Anh Phung
*Attorney, Agent, or Firm*—Burns, Doane, Swecker & Mathis, LLP

[57] ABSTRACT

Provided is a structure in which a refresh region to be actually refreshed can be set on an outside of a DRAM. A refresh control register (21) is provided to store a refresh control bit which is sent from the outside and indicates the region to be refreshed. A refresh address deciding circuit (22) is provided to compare a content (RCB) stored in the refresh control register (21) with a refresh address (RAi) output from a refresh address generating circuit (11). An internal timing control circuit (5A) stops operations of a row decoder (3) and a sense amplifier (4) according to a result of a decision made by the refresh address deciding circuit (22).

8 Claims, 8 Drawing Sheets

VOLATILE MEMORY AND EMBEDDED DYNAMIC RANDOM ACCESS MEMORY

BACKGROUND OF THE INVENTION

1. Field of the Invention

The present invention relates to a volatile memory which is required to operate with low power, and a volatile memory module of an embedded dynamic random access memory (hereinafter referred to as an eRAM) in which a processor and a memory are provided together, that is, a dynamic random access memory (hereinafter referred to as a DRAM), and more particularly to self-refresh of the volatile memory or the DRAM provided in the eRAM.

2. Description of the Background Art

Recently, memories to be used in a field requiring low power consumption such as portable equipment or the like have also had capacities increased with an advancement of information processing and an increase of information. These memories include a volatile memory such as a DRAM which features a large capacity and space-saving. A reduction in power consumption has been required for the DRAM and the like which are to be used in such a field in the same manner as in apparatus which incorporate them.

With a development of fineness, a microprocessor and a DRAM can be provided together in one chip. Programs and data are stored in a high speed built-in large capacity memory so that a processing can be performed at a high speed. In the following description, an EDRAM includes the microprocessor and the DRAM in one chip.

In some cases where the volatile memory such as the DRAM and the eRAM are incorporated in the above-mentioned portable equipment, programming is performed in consideration of a memory use region such as a program size, a data size or the like in order to increase performance within a range in which a memory size is limited. For this reason, whether or not all regions of the volatile memory such as the DRAM are used depends on programs to be executed.

The contents stored in the volatile memory disappear with the passage of time. Therefore, a refresh operation is required. In particular, it is necessary to generate a control signal timing and a refresh address in the volatile memory in order to hold the stored contents when an operation of a system provided on the periphery of the volatile memory is stopped. For this reason, the volatile memory has a built-in oscillator in such a manner that it can perform a self-refresh operation.

FIG. 8 is a block diagram showing an example of a structure of a conventional DRAM which can perform the self-refresh operation. Since data held in a memory array 2 disappears with the passage of time, a DRAM 1 should operate in various cycles other than a read cycle and a write cycle to perform writing and reading while holding the stored contents. In writing to and reading from the memory array 2, a word line is selected by a row decoder 3, and also a sense amplifier 4 is selected with a row address depending on circumstances. The DRAM 1 includes an internal timing control circuit 5 for generating, in various cycles, internal timing control signals WLE, SAE and the like which are to be sent to each of internal modules such as the row decoder 3 and the sense amplifier 4. Therefore, a row address strobe signal RAS and a column address strobe signal CAS which give a reading timing of an address Ai and a self-refresh signal SRF which gives a self-refresh period are sent from an outside of the DRAM 1 to the internal timing control circuit 5 through an input terminal 13. In order to store data in the DRAM 1, it is necessary to specify a storage location on the memory array 2. For this reason, the address Ai input from the outside to an input terminal 14 is temporarily stored in an address latch 6. A row address Ari in the address Ai stored in the address latch 6 is given to the row decoder 3, and a column address is given to a column decoder. The row address and the column address are decoded by these decoders so that a word line 16 is selectively activated and the sense amplifier 4 or its output is selected. Consequently, data is read from and written to a desired portion of the memory array 2.

Next, a module related to the self-refresh will be described. A refresh interval at which the self-refresh is to be performed is determined by an oscillator 10. The oscillator 10 is on-off controlled in response to an operating mode signal Mode. The operating mode signal Mode is determined on the basis of a control signal group sent from the outside of the DRAM 1 to the input terminal 13, for example, RAS, CAS, SRF and the like. An output intC of the oscillator 10 is input, to the internal timing control circuit 5, as a trigger of an internal timing control signal output from the internal timing control circuit 5 when the self-refresh is performed.

A refresh address is generated by a refresh address generating circuit 11 formed by a counter. A timing for generating the refresh address is determined in response to an address control signal Sac sent from the internal timing control circuit 5. A count value of the address control signal Sac acts as a refresh address RAi, for example. In the refresh address generating circuit 11, a count of the address control signal Sac means address generation and means self-refresh termination of all memory cells which require counter resetting to be performed when the count value reaches a predetermined value.

The refresh address RAi generated by the refresh address generating circuit 11 is selected by an address selecting circuit 12 according to the address control signal Sac, and is transmitted to the row decoder 3. Thus, a memory cell connected to the word line 16 which is selected with the refresh address RAi is refreshed.

The above refresh operation will be summarized. The refresh address RAi is generated in a cycle of the output intC of the oscillator 10. The word line 16 is caused to sequentially rise with the refresh address RAi. Rewriting is performed by the sense amplifier 4 so that the contents of the memory array 2 are held.

The volatile memory or the eRAM including the volatile memory module according to the prior art has the above-mentioned structure. These memories are often utilized for various purposes. Therefore, whether or not internal regions of the memories are utilized for actual programs, the self-refresh is uniformly performed. The self-refresh is different from CBR (CAS before RAS) refresh and the like, for example. Once a self-refresh mode is started, an operation is independently performed by using the internal oscillator. For this reason, a portion which does not need to be self-refreshed is refreshed in the same manner as a portion which should be self-refreshed. Consequently, power is wastefully consumed due to the refresh operation in the portion which does not need to be self-refreshed.

SUMMARY OF THE INVENTION

A first aspect of the present invention is directed to a volatile memory wherein a region of a memory array which is specified in response to a control signal is not self-refreshed also in a self-refresh mode.

A second aspect of the present invention is directed to the volatile memory according to the first aspect of the present invention, wherein operations of a row decoder and a sense amplifier are stopped during the self-refresh in the region of the memory array which is specified in response to the control signal.

A third aspect of the present invention is directed to the volatile memory according to the second aspect of the present invention, comprising an internal timing control circuit for on-off controlling the sense amplifier and the row decoder, a refresh address generating circuit for sequentially generating a refresh address in response to an instruction of the internal timing control circuit, a refresh control register for storing a refresh control bit which serves to function as the control signal and to specify a region that does not need to be self-refreshed, and for outputting the refresh control bit under control of the internal timing control circuit, and a refresh address deciding circuit for making a comparison between information indicated by the refresh address and information indicated by the refresh control bit output from the refresh control register and for outputting a refresh deciding signal to give an instruction to turn off the sense amplifier and the row decoder to the internal timing control circuit according to a result of the comparison.

A fourth aspect of the present invention is directed to the volatile memory according to the third aspect of the present invention, further comprising an output terminal for outputting the refresh deciding signal to an outside of the volatile memory.

A fifth aspect of the present invention is directed to an embedded dynamic random access memory comprising a processing unit formed on one substrate for outputting a refresh control bit to specify a region of a memory array corresponding to a memory space which is not necessary for execution of a program, and a dynamic random access memory formed on the substrate and connected to the processing unit for performing no self-refresh for the region of the memory array which is specified in response to the refresh control bit and corresponds to the memory space even if a self-refresh mode is set.

A sixth aspect of the present invention is directed to the embedded dynamic random access memory according to the fifth aspect of the present invention, wherein the dynamic random access memory stops, during the self-refresh, operations of a row decoder and a sense amplifier in the region of the memory array which is specified in response to the refresh control bit and corresponds to the memory space.

A seventh aspect of the present invention is directed to the embedded dynamic random access memory according to the sixth aspect of the present invention, wherein the dynamic random access memory includes an internal timing control circuit for on-off controlling the sense amplifier and the row decoder, a refresh address generating circuit for sequentially generating a refresh address in response to an instruction of the internal timing control circuit, a refresh control register for storing the refresh control bit and for outputting the refresh control bit under control of the internal timing control circuit, and a refresh address deciding circuit for making a comparison between information indicated by the refresh address and information indicated by the refresh control bit output from the refresh control register and for outputting a refresh deciding signal to give an instruction to turn off the sense amplifier and the row decoder to the internal timing control circuit according to a result of the comparison.

An eighth aspect of the present invention is directed to the embedded dynamic random access memory according to the seventh aspect of the present invention, further comprising a bus for connecting the processing unit and the dynamic random access memory, the processing unit having a memory/bus control circuit for inputting the refresh deciding signal to control the bus in consideration of execution of operation stoppage for the sense amplifier and the row decoder which is indicated by the refresh deciding signal.

According to the first aspect of the present invention, the region which should be self-refreshed can be set and the region of the memory array which does not store information is not refreshed. Consequently, it is possible to eliminate unnecessary power consumption.

According to the second aspect of the present invention, the operations of the row address decoder and the sense amplifier are stopped while the self-refresh is not performed. Consequently, unnecessary consumed power can be reduced.

According to the third aspect of the present invention, the refresh control bit is stored in the refresh control register to cause the refresh address deciding circuit to make a decision in conformity with the stored contents. Thus, the region which should be self-refreshed can optionally be set so that versatility can be obtained.

According to the fourth aspect of the present invention, it is possible to decide, on the outside of the volatile memory, that the region which does not need to be self-refreshed is not subjected to refresh operations other than the self-refresh indeed in response to the refresh deciding signal output to the outside, to properly mediate a collision of the refresh operations other than the self-refresh with an access request to the volatile memory, and to prevent a use efficiency of the bus from being reduced.

According to the fifth aspect of the present invention, the region in the dynamic random access memory which should be self-refreshed can be set according to the program to be executed by the processing unit. The region in the memory array which is not used during the execution of the program is not self-refreshed. Thus, unnecessary power consumption can be eliminated.

According to the sixth aspect of the present invention, the operations of the row address decoder and the sense amplifier are stopped while the self-refresh is not performed. Consequently, unnecessary consumed power can be reduced.

According to the seventh aspect of the present invention, the refresh control bit set to an internal register of the processing unit is stored in the refresh control register of the DRAM, and the refresh address deciding circuit makes a decision in conformity with the stored contents. Thus, the region which should be self-refreshed can optionally be set so that versatility can be obtained.

According to the eighth aspect of the present invention, the memory/bus control circuit can decide that refresh operations other than the self-refresh are not performed indeed for the regions which do not need to be self-refreshed in response to the refresh deciding signal output from the DRAM, a collision of the refresh operations other than the self-refresh with an access request to the DRAM can properly be mediated, and a use efficiency of the bus provided between the processing unit and the DRAM can be prevented from being reduced. Consequently, the memory/bus control circuit does not need to have address information.

In order to solve the above-mentioned problems, it is an object of the present invention to distinguish memory regions of a volatile memory or a volatile memory module which should be self-refreshed for actual use from memory regions which do not need to be self-refreshed so as not to unnecessarily refresh the regions which do not need to be self-refreshed, thereby reducing consumed power.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
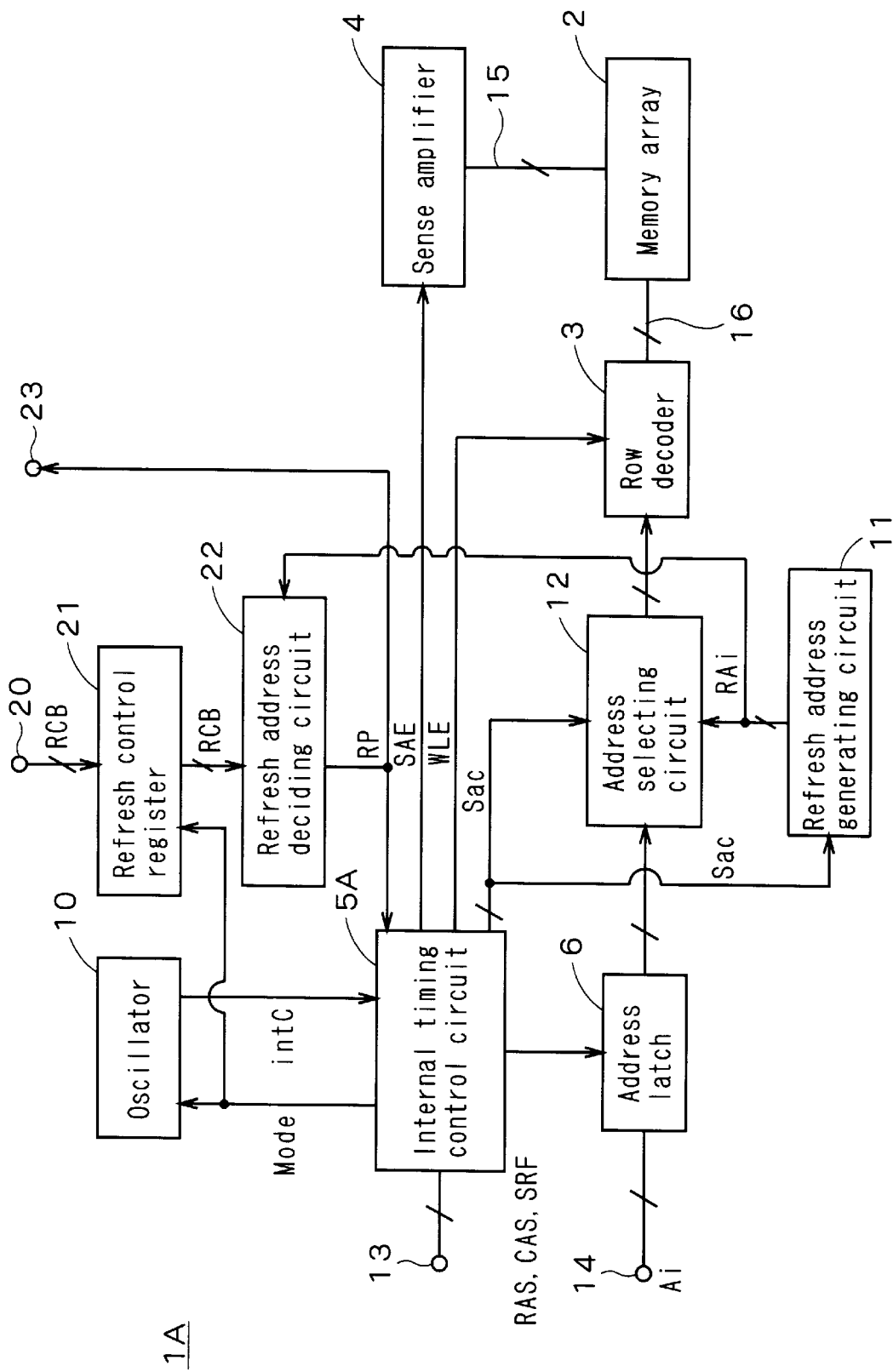
FIG. 1 is a block diagram showing an example of a structure of a DRAM according to a first embodiment of the present invention.
Figure 8:
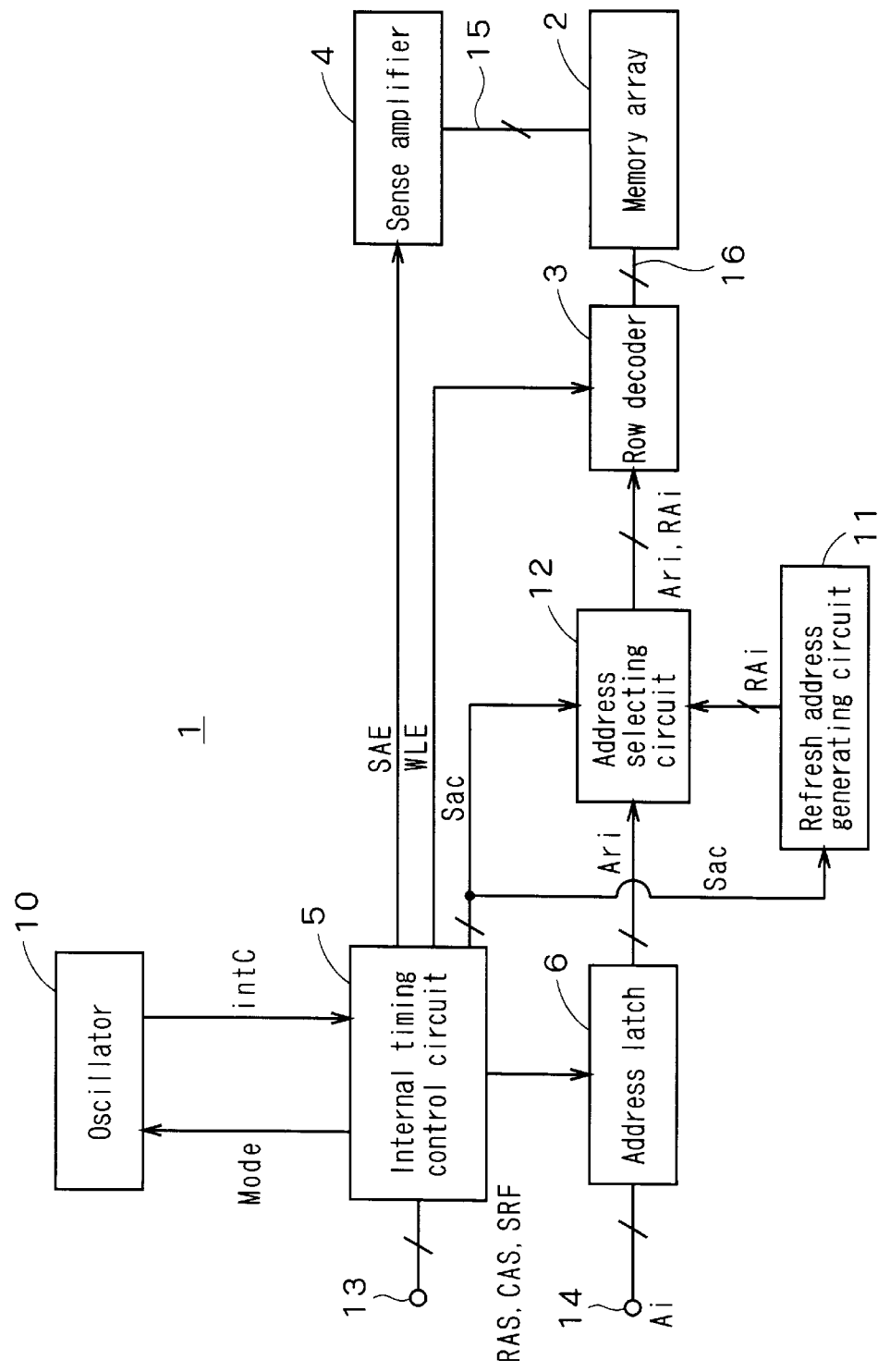
FIG. 8 is a block diagram showing an example of a structure of a DRAM according to the prior art.

First Embodiment A DRAM according to a first embodiment of the present invention can set regions which should be self-refreshed, that is, regions which do not need to be self-refreshed in response to a control signal sent from an outside of the DRAM. FIG. 1 is a block diagram showing a structure of the DRAM according to the first embodiment of the present invention. In order to set the regions which should be self-refreshed, a DRAM 1A shown in FIG. 1 further comprises a refresh control register 21 and a refresh address deciding circuit 22 as compared with the DRAM 1 according to the prior art, and has an internal timing control circuit 5A improved. The same designations as those in FIG. 8 correspond to the same portions as those in FIG. 8.

In order to distinguish regions of a memory array 2 which should be self-refreshed from regions which do not need to be self-refreshed, a refresh control bit RCB is input from an outside of the DRAM 1A to an input terminal 20. The refresh control register 21 is connected to the input terminal 20 and serves to store the refresh control bit RCB. An operating mode signal Mode is sent from the internal timing control circuit 5A to the refresh control register 21 in order to get a timing for outputting the stored refresh control bit RCB. High order N bits of a refresh address RAi are input as information on the refresh address RAi to the refresh address deciding circuit 22. The high order N bits of the refresh address RAi, that is, the information indicated by the refresh address RAi are compared with information indicated by the refresh control bit RCB. According to a result of the comparison, the refresh address deciding circuit 22 outputs a refresh deciding signal RP. The refresh deciding signal RP is input to the internal timing control circuit 5A and is output from an output terminal 23 to the outside of the DRAM 1A. The internal timing control circuit 5A receives the refresh deciding signal RP, and stops operations of a row decoder 3 and a sense amplifier 4 in response to internal control signals WLE and SAE. Consequently, the DRAM 1A does not perform a self-refresh operation for regions specified by the refresh control bit RCB. Whether or not the self-refresh operation is to be performed is selected. Therefore, it is sufficient that either of the regions is specified. Even if the regions which should be self-refreshed are specified by using the refresh control bit RCB, the same result can be obtained.

A structure is formed in such a manner that the refresh deciding signal RP is also output to the outside of the DRAM 1A through the output terminal 23. With such a structure, a period for which refresh operations other than the self-refresh are performed and a period for which only a refresh signal is output and the refresh operations are not performed can be detected on the outside of the DRAM 1A with the refresh deciding signal RP. In other words, the refresh control bit RCB effectively functions also when the refresh operations other than the self-refresh are performed. Consequently, the refresh deciding signal RP is output also in the refresh operation performed with the use of the DRAM 1A as well as in the self-refresh mode. In a case where an ordinary read/write access is requested from a CPU or the like in the DRAM 1 according to the prior art, a next access is kept waiting until the refresh operation of the DRAM 1 is completed. However, the DRAM 1A according to the first embodiment does not need to perform the refresh operation for the regions specified as portions where the refresh operation is not necessary by the refresh control bit RCB also in refresh modes other than the self-refresh mode. If the refresh deciding signal RP is monitored, the next access can be started without waiting for the completion of a refresh request also in the refresh modes other than the self-refresh mode. For the regions which do not need to be refreshed, a next access request is accepted earlier because of no refresh operation.

Figure 2:
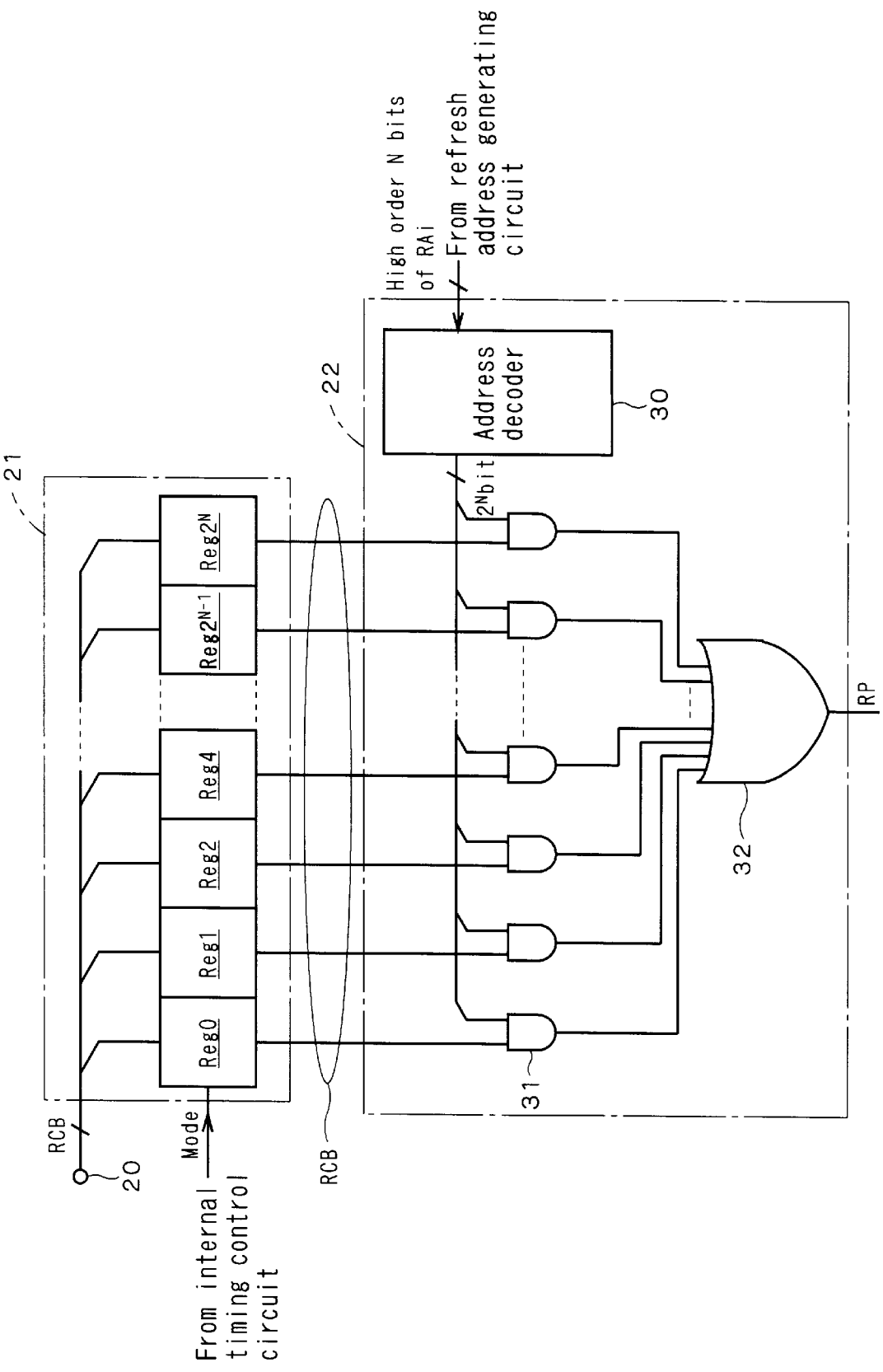
FIG. 2 is a circuit diagram showing an example of structures of a refresh control register and a refresh address deciding circuit in FIG. 1.

Next, an example of structures of the refresh control register 21 and the refresh address deciding circuit 22 and their operations will be described with reference to FIGS. 2 to 4. As shown in FIG. 2, the refresh control register 21 is formed by registers Reg 0 to Reg $2^N$ for storing each of the refresh control bits RCB, respectively. The refresh address deciding circuit 22 includes an address decoder 30 for decoding high order N bits of the refresh address RAi, AND gates 31 for outputting ANDs of output bits of the address decoder 30 and the refresh control bits RCB, and a NOR gate 32 to OR outputs of all the AND gates 31. Consequently, when a position of a line which is selected by the address decoder 30 and is set to a high level is coincident with a position of any of the registers Reg 0 to Reg $2^N$ which stores "0", the outputs of all the AND gates 31 are set to a low level and the NOR gate 32 outputs the low level in the refresh address deciding circuit 22.

Figure 3:
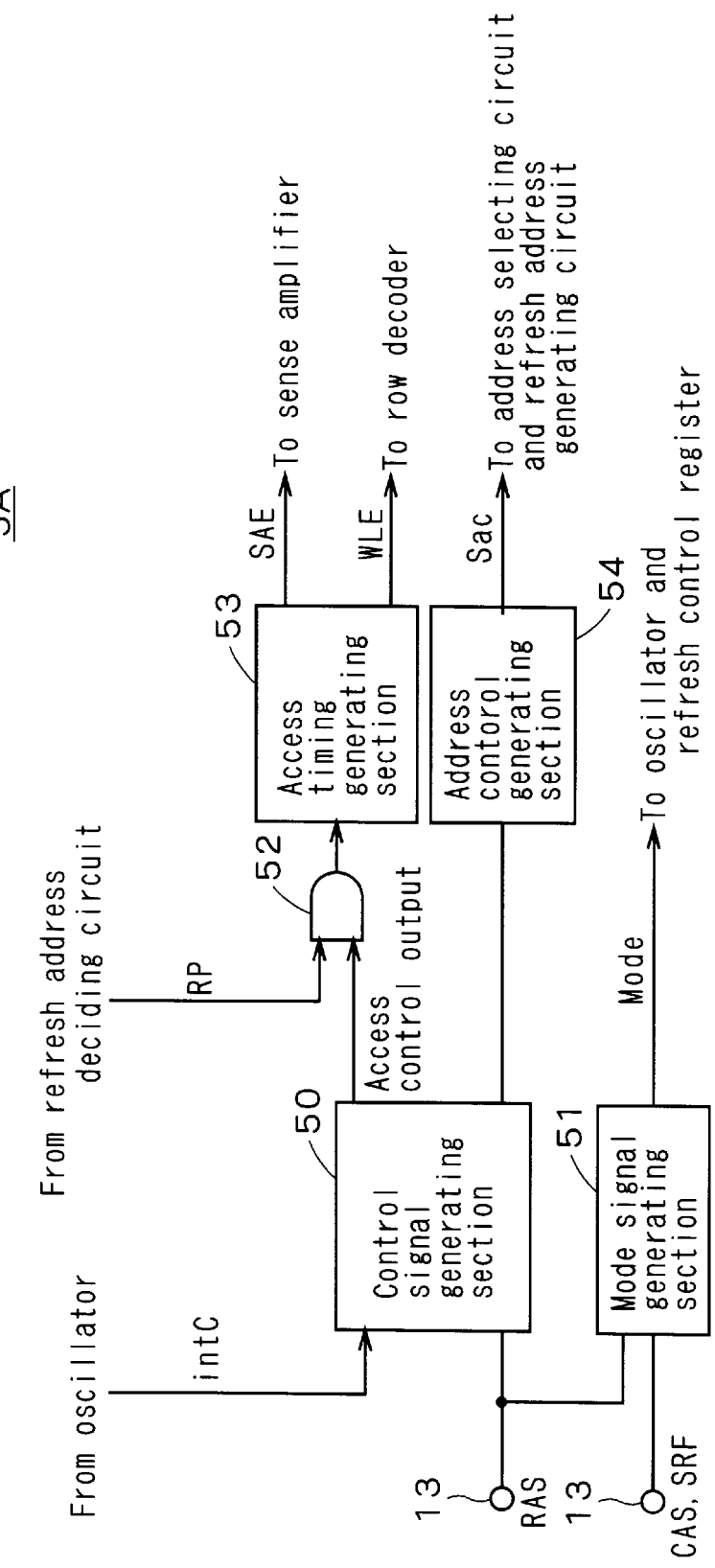
FIG. 3 is a block diagram showing an example of a structure of an internal timing control circuit in FIG. 1.

As shown in FIG. 3, the internal timing control circuit 5A includes a control signal generating section 50 for generating an access control output from a row address strobe signal RAS and an output intC of the oscillator 10, a mode signal generating section 51 for generating a mode signal Mode from a column address strobe signal CAS and a self-refresh signal SRF, an AND gate 52 for outputting AND of the access control output and the refresh deciding signal RP, an access timing generating section 53 for generating internal control signals SAE and WLE from an output of the AND gate 52, and an address control generating section 54 for generating an address control signal Sac from the access control output. For this reason, the internal timing control circuit 5A can set the row decoder 3 and the sense amplifier 4 into a non-operation state in response to the internal control signals SAE and WLE.

Figure 4:
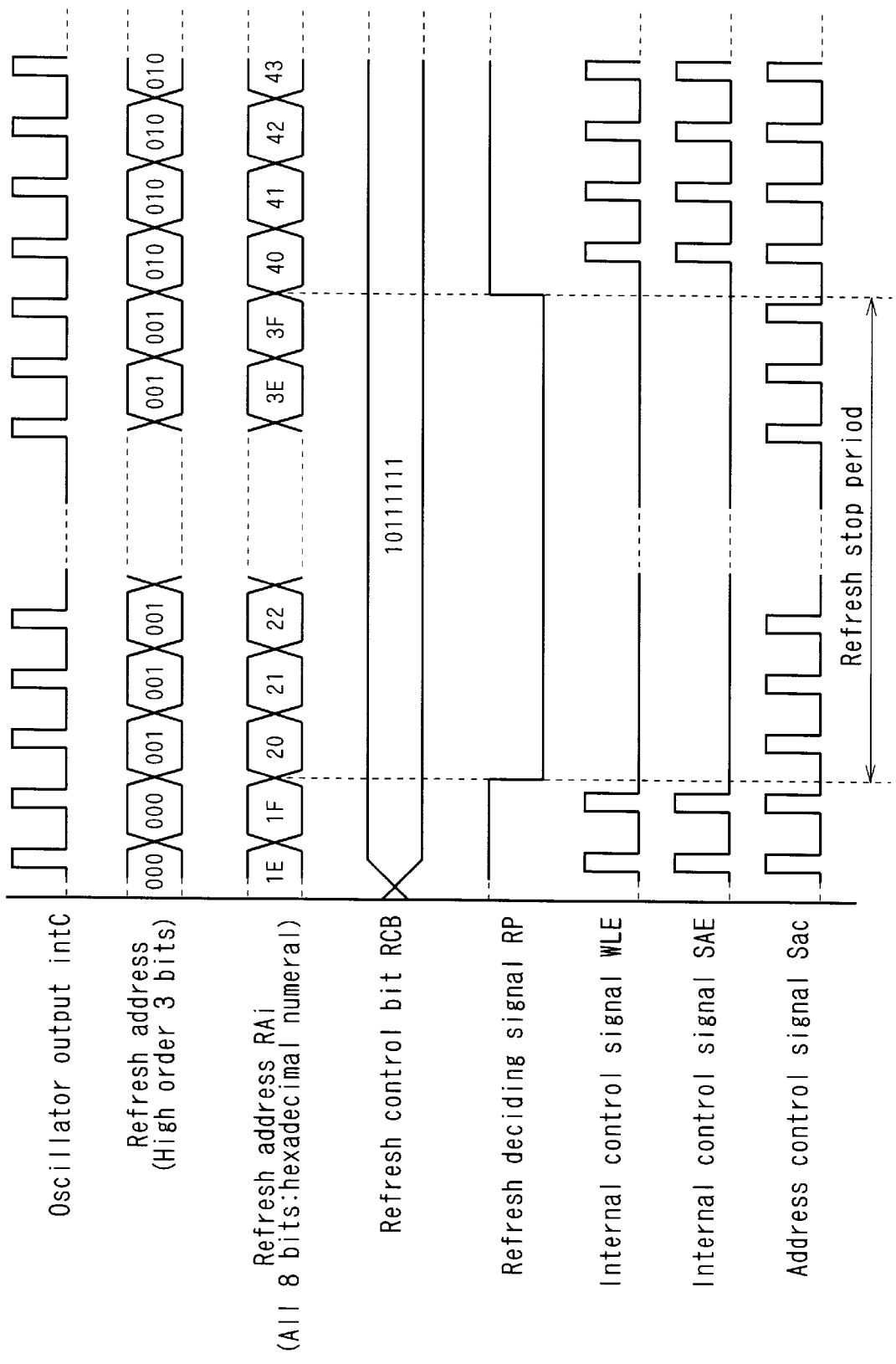
FIG. 4 is a timing chart illustrating an operation of the DRAM shown in FIG. 1.

FIG. 4 shows an example in which when the refresh control bits RCB stored in the registers Reg 0 to Reg $2^N$ are "10111111", the self-refresh operation is stopped by using the internal timing control circuit 5A in FIG. 3 if the refresh address RAi is "20" to "3F" in a hexadecimal numeral, that is, high order 3 bits of the refresh address RAi are "001" in a binary numeral.

While the self-refresh operation has been described with reference to FIGS. 2 to 4, other refresh operations are performed in the same manner as the self-refresh operation.

Second Embodiment

Figure 5:
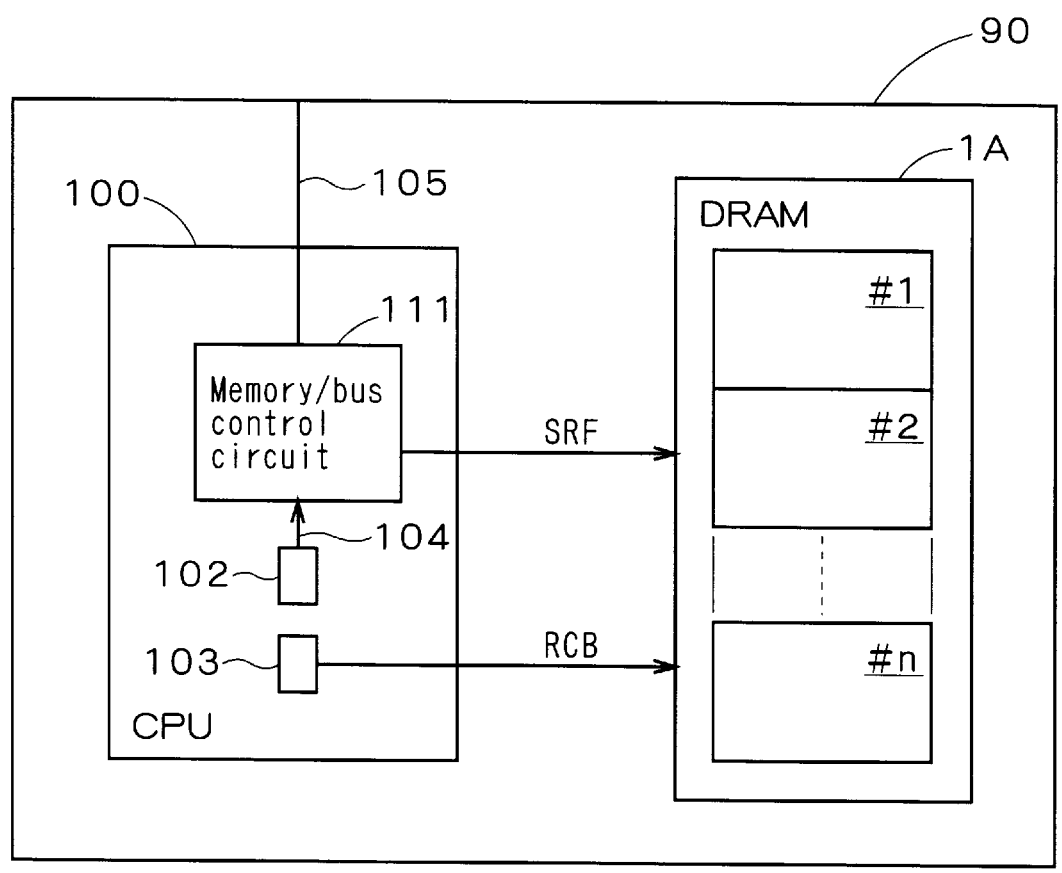
FIG. 5 is a block diagram showing an example of a structure of an eRAM according to a second embodiment of the present invention.
Figure 6:
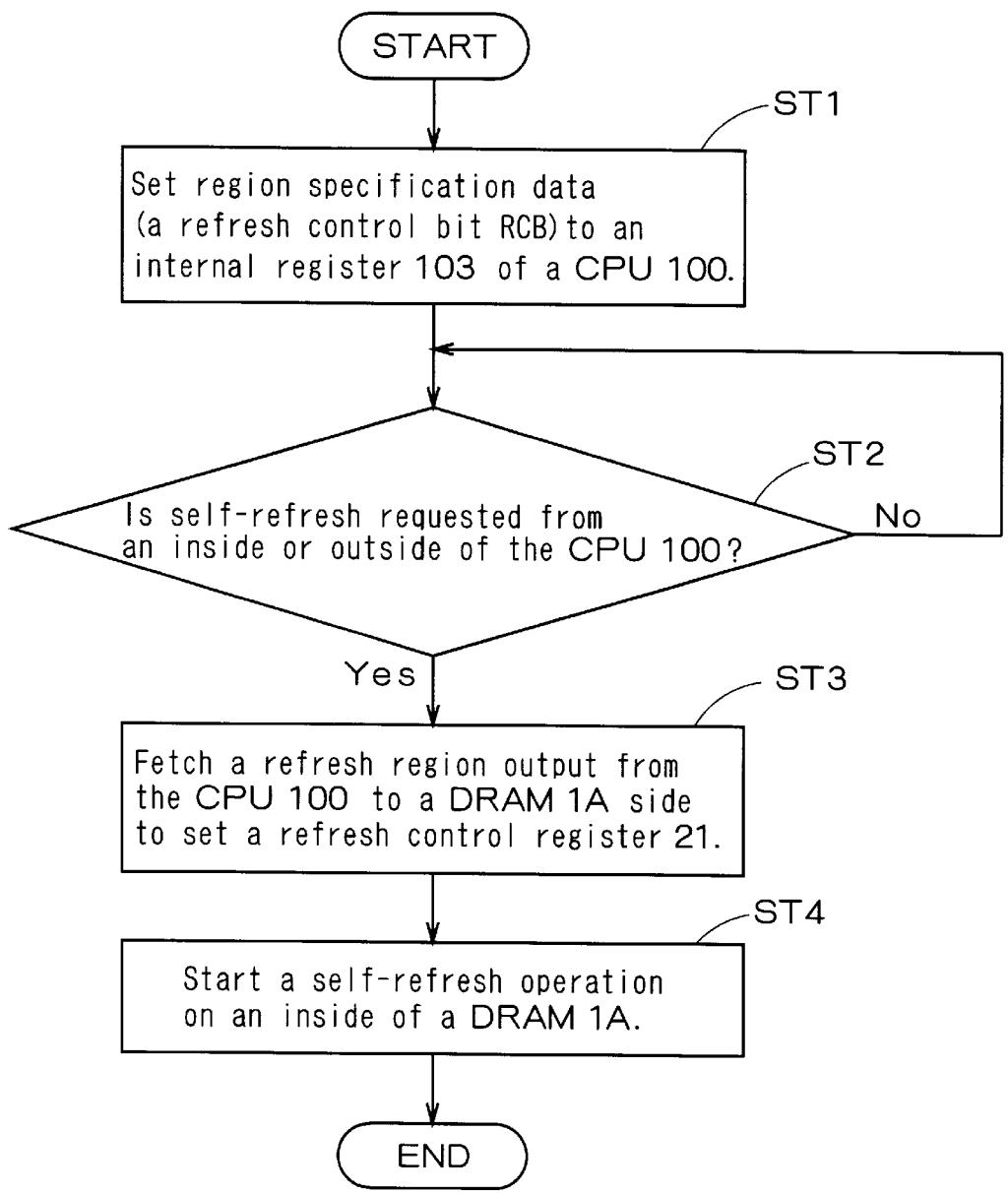
FIG. 6 is a flowchart for explaining an operation of the eRAM in FIG. 5.

Next, an eRAM according to a second embodiment of the present invention will be described with reference to FIGS. 5 and 6. An eRAM 90 shown in FIG. 5 is formed on one substrate, and comprises a CPU 100 and the DRAM 1A described in the first embodiment. A signal 105 input from an outside of the eRAM 90 to the CPU 100 serves to request self-refresh from the outside of the eRAM 90. The signal 105 is sent to a memory/bus control circuit 111. If the self-refresh is requested by the signal 105, the memory/bus control circuit 111 outputs a self-refresh signal SRF to the DRAM 1A. The CPU 100 has an internal register 102. Bits are set to the internal register 102 so that the memory/bus control circuit 111 generates a signal 104 which requests the self-refresh. In other words, the signal 104 serves to request the self-refresh if necessary in the CPU 100. The memory/bus control circuit 111 also waits for the signal 104 generated by the internal register 102. Similarly, when the signal 104 is input to the memory/bus control circuit 111, the memory/bus control circuit 111 outputs the self-refresh signal SRF.

The CPU 100 includes an internal register 103 to store a refresh control bit RCB for specifying any of regions #1 to #n of a memory array 2 which should be self-refreshed. The refresh control bit RCB can be set to the internal register 103 by various methods such as implementation using a load instruction and an immediate set instruction which are sent from a memory, addition of a dedicated instruction, an access to a dedicated space and the like in the same manner as setting of a general purpose register of an ordinary CPU. In other words, regions which should be self-refreshed or regions which do not need to be self-refreshed are determined according to a program. Therefore, the refresh control bit RCB can be set when the program is to be written, for example. When a self-refresh request is sent from the memory/bus control circuit 111 to the DRAM 1A, the DRAM 1A restricts the regions which should be self-refreshed in response to the refresh control bit RCB output from the internal register 103. The CPU 100 turns all-on the internal register 103 when the regions for the self-refresh are not specified.

The above-mentioned operation will be described with reference to a flowchart shown in FIG. 6. First of all, the refresh control bit RCB is set to the internal register 103 of the CPU 100 at Step ST1. Next, the memory/bus control circuit 111 decides whether or not self-refresh is requested from an inside or outside of the CPU 100 (Step ST2). A refresh region output from the CPU 100, that is, the refresh control bit RCB is fetched to a DRAM 1A side to set a refresh control register 21 (Step ST3). A self-refresh operation is started in the DRAM 1A (Step ST4).

The eRAM 90 includes the internal register 103 having the above-mentioned function in the CPU 100 in addition to the DRAM 1A described in the first embodiment. Also in the eRAM 90, consequently, it is possible to easily specify the regions which should be self-refreshed.

Figure 7:
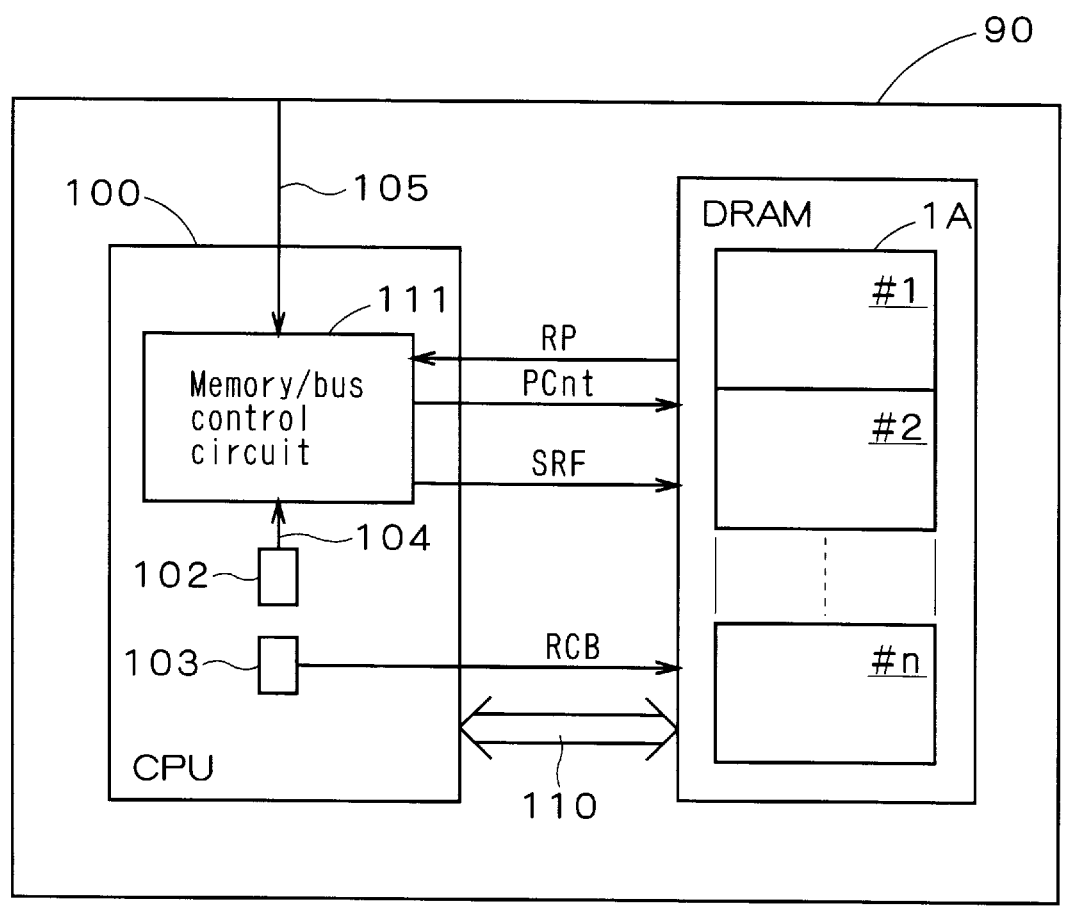
FIG. 7 is a block diagram showing another example of the structure of the eRAM according to the second embodiment of the present invention.

As shown in FIG. 7, a refresh deciding signal RP can be sent to the memory/bus control circuit 111 for controlling a bus 110 and controlling the DRAM 1A in response to a DRAM control signal DCnt, thereby adding the following function to the memory/bus control circuit 111 in the same manner as described in the first embodiment. More specifically, while the DRAM 1A is set to a mode other than a self-refresh mode by the memory/bus control circuit 111 but refresh operations other than the self-refresh are performed in the regions which do not need to be self-refreshed, the memory/bus control circuit 111 releases inhibition of data transfer between the CPU 100 and the DRAM 1A through the bus 110 in response to a read/write access request sent from the CPU 100 and causes the CPU 100 and the DRAM 1A to effectively use the bus 110. In this case, an RCB fetch timing is specified on a DRAM control side in response to the DRAM control signal DCnt in addition to setting of the refresh control bit RCB which is performed when the self-refresh operation is carried out. Consequently, a refresh control bit is set in a timing other than the self-refresh operation.

As described in the first embodiment, the structure of the eRAM 90 can easily be obtained even if the regions which do not need to be self-refreshed are specified.

While the invention has been described in detail, the foregoing description is in all aspects illustrative and not restrictive. It is understood that numerous other modifications and variations can be devised without departing from the scope of the invention.

We claim:

1. A volatile memory comprising:

means for generating a refresh control signal specifying first and second regions of a memory array in a self refresh mode;

refresh control means for performing self-refresh for said first region and performing no self-refresh for said second region on the basis of said refresh control signal in a self refresh mode.

2. The volatile memory according to claim 1, wherein operations of a row decoder and a sense amplifier are stopped during said self-refresh in said second region on the basis of said refresh control signal.

3. The volatile memory according to claim 2, comprising:

an internal timing control circuit for on-off controlling said sense amplifier and said row decoder;

a refresh address generating circuit for sequentially generating a refresh address in response to an instruction of said internal timing control circuit;

a refresh control register for storing a refresh control bit which serves to function as said refresh control signal, and for outputting said refresh control bit under control of said internal timing control circuit; and a refresh address deciding circuit for making a comparison between information indicated by said refresh control address and information indicated by said refresh control bit output from said refresh control register and for outputting a refresh deciding signal to give an instruction to turn off said sense amplifier and said row decoder to said internal timing control circuit according to a result of said comparison.

4. The volatile memory according to claim 3, further comprising an output terminal for outputting said refresh deciding signal to an outside of said volatile memory.

5. An embedded dynamic random access memory comprising:

a processing unit formed on one substrate for outputting a refresh control bit to specify first and second regions of a memory array corresponding to first and second memory space, wherein said first memory space is necessary and said second memory space is not necessary for execution of a program; and a dynamic random access memory formed on said substrate and connected to said processing unit for performing self-refresh for said first region corresponding to said first memory space and performing no self-refresh for said second region corresponding to said second memory space of said memory array on the basis of said refresh control bit even if a self-refresh mode is set by an instruction of said processing unit.

6. The embedded dynamic random access memory according to claim 5, wherein said dynamic random access memory stops, during said self-refresh, operations of a row decoder and a sense amplifier in said region of said memory array which is specified in response to said refresh control bit and corresponds to said memory space.

7. The embedded dynamic random access memory according to claim 6, wherein said dynamic random access memory includes:

an internal timing control circuit for on-off controlling said sense amplifier and said row decoder;

a refresh address generating circuit for sequentially generating a refresh address in response to an instruction of said internal timing control circuit;

a refresh control register for storing said refresh control bit and for outputting said refresh control bit under control of said internal timing control circuit; and a refresh address deciding circuit for making a comparison between information indicated by said refresh address and information indicated by said refresh control bit output from said refresh control register and for outputting a refresh deciding signal to give an instruction to turn off said sense amplifier and said row decoder to said internal timing control circuit according to a result of said comparison.

8. The embedded dynamic random access memory according to claim 7, further comprising a bus for connecting said processing unit and said dynamic random access memory, said processing unit having a memory/bus control circuit for inputting said refresh deciding signal to control said bus in response to said refresh deciding signal.

* * * * *